United States Patent
Seibald et al.

(10) Patent No.: US 11,441,070 B2
(45) Date of Patent: *Sep. 13, 2022

(54) RED EMITTING LUMINESCENT MATERIAL

(71) Applicant: OSRAM Opto Semiconductors GmbH, Regensburg (DE)

(72) Inventors: Markus Seibald, Kaufering (DE); Tim Fiedler, Landsberg am Lech (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 17/187,263

(22) Filed: Feb. 26, 2021

(65) Prior Publication Data

US 2021/0179934 A1  Jun. 17, 2021

Related U.S. Application Data

(63) Continuation of application No. 15/772,498, filed as application No. PCT/EP2016/076553 on Nov. 3, 2016, now Pat. No. 10,968,388.

(30) Foreign Application Priority Data

Nov. 6, 2015  (DE) ................... 10 2015 119 149.0

(51) Int. Cl.
*C09K 11/77* (2006.01)
*C09K 11/08* (2006.01)
*H01L 33/50* (2010.01)

(52) U.S. Cl.
CPC ...... *C09K 11/7734* (2013.01); *C09K 11/0883* (2013.01); *C09K 11/77346* (2021.01); *H01L 33/502* (2013.01)

(58) Field of Classification Search
CPC ............................................. C09K 11/777346
See application file for complete search history.

(56) References Cited

U.S. PATENT DOCUMENTS 10,968,388 B2 * 4/2021 Seibald ................. H01L 33/502
2015/0123155 A1 5/2015 Schmidt et al.

FOREIGN PATENT DOCUMENTS

| CN | 101679863 A | 3/2010 |
| CN | 104781369 A | 7/2015 |
| DE | 102007018099 A1 | 10/2008 |
| JP | 2015526532 A | 9/2015 |
| WO | 2013175336 A1 | 11/2013 |
| WO | 2015135888 A1 | 9/2015 |
| WO | 2016066683 A1 | 5/2016 |

OTHER PUBLICATIONS

Watanabe et al., "Synthetic Method and Luminescence Properties of Srx Ca1-x AlSiN3:Eu2+ Mixed Nitride Phosphors" Journal of the The Electrochemical Society, 155 (3), pp. F31-F36 (2008).

(Continued)

*Primary Examiner* — C Melissa Koslow
(74) *Attorney, Agent, or Firm* — ArentFox Schiff

(57) ABSTRACT

A red-emitting phosphor comprising an $Eu^{2+}$ doped nitrido-aluminate phosphor is provided. The red emitting phosphor comprises an emission maximum in the range of 610 to 640 nm of the electromagnetic spectrum.

16 Claims, 2 Drawing Sheets

Figures 1, 2:
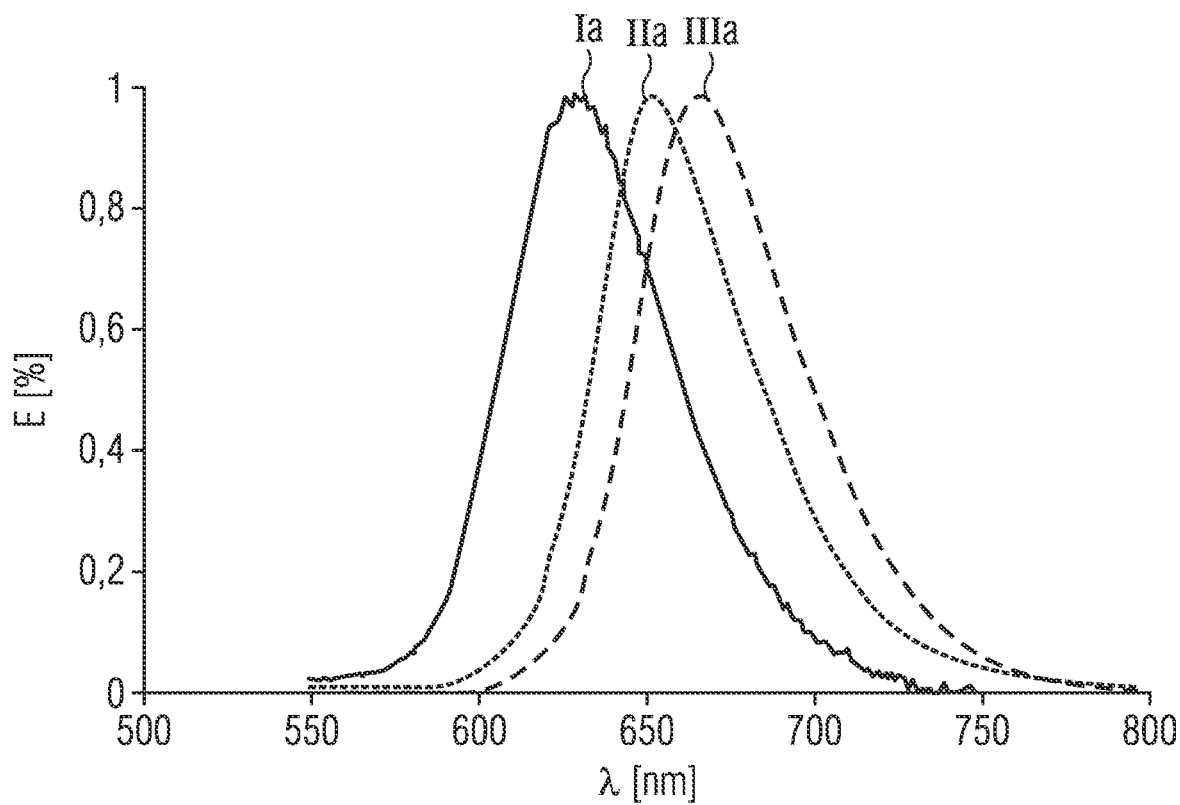

| | $\lambda_{dom}$/nm | $\lambda_{max}$/nm | x, y | LE | FWHM/nm |
|---|---|---|---|---|---|
| A2 | 609 | 626 | 0.664; 0.336 | > 25% | 57 |
| A1 | 611 | 634 | 0.670; 0.330 | ~ 25% | 57 |
| $SrLiAl_3N_4:Eu^{2+}$ | > 625 | ~ 650 | 0.706; 0.294 | ~ 10% | ~ 50 |
| $SrLiAl_3N_4:Eu^{2+}$ * | ~ 630 | ~ 654 | 0.711; 0.289 | < 10% | ~ 50 |
| $CaLiAl_3N_4:Eu^{2+}$ * | | ~ 670 | 0.720; 0.280 | | ~ 60 |
| $CaLiAl_3N_4:Eu^{2+}$ * | ~ 640 | ~ 670 | 0.721; 0.279 | < 5% | ~ 60 |

(56) References Cited

OTHER PUBLICATIONS

"Recent Advances in Red Phosphors used in White LED", Wu, Da-hui, Guo Ning; Zhang Li-na; Zhou Shi-lin; 1. School of Environment and Architecture; 2. School of Science, University of Shanghai for Science and Technology, Shanghai 200093, China.

Pust et al, "Group (III) Nitrides M[Mg2Al1N4] (M=Ca,SR,BA,Eu) and Ba[Mg2Ga2N4]-Structural Relation and Nontypical Luminescence Properties of Eu+2 Doped Samples", Chemistry of Materials, 26(21), 2014, pp. 6113-6119, Aug. 26, 2014.

Singh et al. "Recent Progress in Nitride-Based Red Emitting Phosphors" Rev. Adv. Mater. Sci 44 (2016) 134-145, May 25, 2015.

Watanabe et al. "Synthesis of Sr0.99Eu0.01AlSiN3 from intermetallix precursor" Journal of the Ceramic Society of Japan 117[1], 115-119, 2009.

Zhang et al. "Photoluminescence properties of Yb2+ in CaAlSin3 as a novel red-emitting phosphor for white LEDs" J, Mater. Chem. 2012, 22, 23871-23876.

Pust et al. "Narrow-band red-emitting Sr (LiAl3N4): EU2+as a next generation LEDphosphor material" Nature Materials, vol. 13, Sep. 2014, Published Online Jun. 22, 2014 DOI: 10.1038/NMAT4012.

Uheda et al. "Luminescence Properties of a Red Phosphor, CaAlSiN3:EU2+, for White Light-Emitting Diodes" The Electrochemical Society, Electromechanical and Solid-State Letters, 9 (4) H22-H25 (2006), Accessed Feb. 21, 2017.

\* cited by examiner

|  | $\lambda_{dom}$ / nm | $\lambda_{max}$ / nm | x, y | LE | FWHM / nm |
|---|---|---|---|---|---|
| A2 | 609 | 626 | 0.664; 0.336 | > 25% | 57 |
| A1 | 611 | 634 | 0.670; 0.330 | ~ 25% | 57 |
| $SrLiAl_3N_4:Eu^{2+}$ | > 625 | ~ 650 | 0.706; 0.294 | ~ 10% | ~ 50 |
| $SrLiAl_3N_4:Eu^{2+}$ * | ~ 630 | ~ 654 | 0.711; 0.289 | < 10% | ~ 50 |
| $CaLiAl_3N_4:Eu^{2+}$ * |  | ~ 670 | 0.720; 0.280 |  | ~ 60 |
| $CaLiAl_3N_4:Eu^{2+}$ * | ~ 640 | ~ 670 | 0.721; 0.279 | < 5% | ~ 60 |

RED EMITTING LUMINESCENT MATERIAL

The current application claims priority to and the benefit of U.S. patent application Ser. No. 15/772,498, now U.S. Pat. No. 10,968,388, filed on Apr. 30, 2018, which is a national phase application of PCT Application No. PCT/EP2016/076553 filed on Nov. 3, 2016, which claims priority to German Application No. 10 2015 119 149.0 filed on Nov. 6, 2015, the contents of which are hereby incorporated by reference in their entireties.

The invention relates to a red-emitting phosphor, a method for producing a red-emitting phosphor, a use of a red-emitting phosphor in a conversion element and a use of a red-emitting phosphor for the conversion of light.

For devices based on white light emitting diodes (LEDs), especially for backlighting e.g. of displays, there are few solid-state phosphors that meet the requirements of an LED phosphor with emission in the deep red region of the electromagnetic spectrum. So far, mainly two orange to red emitting phosphors of the formula $(Sr,Ba)_2Si_5N_8:Eu^{2+}$ and $(Sr,Ca)AlSiN_3:Eu^{2+}$ are employed. However, these have considerable disadvantages with respect to the emission, the coverage of the color space, the half-width (FWHM=Full Width at Half Maximum) and the spectral filtering. In the case of the phosphor $(Sr,Ba)_2Si_5N_8:Eu$, the emission wavelength can be shifted from the orange to the red spectral region by substituting barium with strontium. However, this substitution reduces the long-term stability of the phosphor.

Furthermore, the phosphors $(Sr)_2Si_5N_8:Eu$ with dominance wavelengths above 605 nm show a significant increase in the half-width, which leads to a reduction in the efficiency and color saturation and therefore limits the possible uses of these phosphors. Although the phosphor $(Sr,Ca)AlSiN_3:Eu^{2+}$ already exhibits emission in the deep red spectral range with dominance wavelengths up to 608 nm, it has a very broad emission which extends into the non-visible region of the electromagnetic spectrum, which reduces the luminescence efficiency of this phosphor. Therefore, the demand for a phosphor having emission in the deep red region of the electromagnetic spectrum, a small half width, and thereby low emission outside the visible region of the electromagnetic spectrum is of great interest.

WO 2013/175336 A1 and Nature Materials 2014, P. Pust et al., "Narrow-band red-emitting $Sr[LiAl_3N_4]:Eu^{2+}$ as a next-generation LED-phosphor material" discloses a phosphor of the formula $SrLiAl_3N_4:Eu^{2+}$ which already has an emission in the deep red region of the electromagnetic spectrum and a small half width of about 50 nm. However, the emitted light of this phosphor ($\lambda_{max}$=650 nm) shows less overlap with the eye-sensitivity curve, especially on its long-wavelength side, so that the luminescent efficiency of this phosphor is low.

The luminescence efficiency of this phosphor is about 10% of the theoretically possible maximum value, which is due to the spectral sensitivity of the eye. In Chemistry of Materials 2014, 26, P. Pust et al., "$Ca[LiAl_3N_4]:Eu^{2+}$—a narrow-band red-emitting nitridolithoaluminate", a phosphor of the formula $CaLiAl_3N_4:Eu^{2+}$ is shown, emitting in the deep red region of the electromagnetic spectrum and a small half-width of about 60 nm. However, compared to $SrLiAl_3N_4:Eu^{2+}$ the emitted light is shifted even further into the red spectral range, i.e. to higher wavelengths, with an emission maximum at about 670 nm, which means that this phosphor has an even smaller overlap with the eye sensitivity curve, especially on its long-wavelength side.

In WO 2015/135888 A1, a red phosphor of the formula $Ca_{18.75}Li_{10.5}Al_{39}N_{55}:Eu$ is described. However, with a maximum emission at 647 nm, this phosphor also shows efficiency losses due to the small overlap with the eye sensitivity curve on its long wavelength side.

The object of at least one embodiment of the present invention is to provide a phosphor which has a deep red emission, exhibits a small half-width and also has a high luminescence efficiency. A further object is to provide an efficient method for producing a red-emitting phosphor, to provide a use of a red-emitting phosphor in a conversion element and a use of a red-emitting phosphor for the conversion of light.

The objects are achieved by a red-emitting phosphor having the features of claims 15, 23, and 31, by a method for preparing a red-emitting phosphor according to aspects of the present disclosure, and by use of a red-emitting phosphor according to aspects of the present disclosure.

It is given a red-emitting phosphor. The phosphor thus has an emission in the red region of the electromagnetic spectrum.

In an embodiment, the red phosphor comprises a nitridoaluminate phosphor. The nitridoaluminate phosphor is doped with $Eu^{2+}$-atoms.

In an embodiment, the red-emitting phosphor has an emission maximum in the range of 610 to 640 nm, preferably in the range of 620 and 635 nm, particularly preferably in the range of 625 and 635 nm, for example at 626 nm or 634 nm. Thus, the emission is in the deep red spectral range of the electromagnetic spectrum. In comparison to the known red-emitting phosphors, the emission maximum of the phosphor according to the invention is shifted to the shorter-wavelength range of the electromagnetic spectrum.

In an embodiment, the red-emitting phosphor emits no or only little radiation outside the visible spectral range. Thus, all or almost all emitted photons are in the sensitivity range of the human eye, which excludes or minimizes the efficiency losses by emission in the non-visible range of the electromagnetic spectrum. This achieves a high luminescence efficiency.

In an embodiment, the red-emitting phosphor has a half-width (Full Width at Half Maximum, FWHM) of less than 65 nm, preferably less than 60 nm, and comprises the elements Ca, Li, Al, N and Eu.

In an embodiment, the red-emitting phosphor has a half-width (Full Width at Half Maximum, FWHM) of less than 65 nm, preferably less than 60 nm. For example, the half width may be between 55 nm inclusive and 58 nm inclusive. The narrow-band emission significantly improves both color saturation and color purity over phosphors with larger half-widths and similar dominant wavelengths.

With such a low half-width and an emission maximum in the range of 610 nm to 640 nm, the red-emitting phosphor emits only or almost only radiation in the visible range of the electromagnetic spectrum. In this way, no or only slightly loss of efficiency by emission occur in the non-visible range of the electromagnetic spectrum. In comparison, the known phosphors $(Sr,Ba)_2Si_5N_8:Eu^{2+}$ have a half-width greater than 90 nm, $(Sr,Ca)AlSiN_3:Eu^{2+}$ a half-width greater than 70 nm, $CaLiAl_3N_4:Eu^{2+}$ a half-width of approximately 60 nm and $SrLiAl_3N_4:Eu^{2+}$ a Half width of about 50 nm.

As a result of the emission maximum of the red-emitting phosphor according to the invention, which is shifted in the shorter-wavelength range of the electromagnetic spectrum compared with the known red-emitting phosphors, and the narrow half-width, the phosphor according to the invention has an increased luminescence efficiency in comparison to the known phosphors. The maximum of the eye sensitivity is 555 nm. The closer the emission maximum of a phosphor is to 555 nm, the fewer losses that lie outside of the eye sensitivity occur when a constant half-width of the phosphor is assumed. Thus, with a constant half width, the luminescence efficiency increases the closer the emission maximum of a red-emitting phosphor is to 555 nm.

In an embodiment, the luminescence efficiency of the red emitting phosphor is more than 25 percent. In comparison, the luminescence efficiency of $SrLiAl_3N_4:Eu^{2+}$ is about 10 percent, for $CaLiAl_3N_4:Eu^{2+}$ it is well below 5 percent. Thus, the red-emitting phosphor according to the invention has a luminescence efficiency which is increased by at least a factor of 2 in comparison to $SrLiAl_3N_4:Eu^{2+}$ and a luminescence efficiency which is increased by about a factor of 6 in comparison to $CaLiAl_3N_4:Eu^{2+}$. The high luminescence efficiency makes the red-emitting phosphor according to the invention very interesting for backlighting applications, in particular for use in a conversion element of an LED.

In an embodiment, the red-emitting phosphor has a dominant wavelength of $\lambda<620$ nm, preferably $\lambda<615$ nm. The dominant wavelength is the monochromatic wavelength which produces the same color impression as a polychromatic light source.

In the CIE color space, the line connecting a point for a particular color and the point (x=0.333; y=0.333) can be extrapolated to meet the outline of the space in a maximum of two points. The point of intersection closer to said color represents the dominant wavelength of the color as the wavelength of the pure spectral color at that point of intersection. The dominant wavelength is therefore the wavelength that is perceived by the human eye. In general, the dominant wavelength deviates from a maximum intensity wavelength. In particular, the dominant wavelength in the red spectral range is at shorter wavelengths than the wavelength of maximum intensity.

According to an embodiment, the red-emitting phosphor comprises the elements Ca, Li, Al, N and Eu or consists of these elements.

If the red-emitting phosphor consists of the elements Ca, Li, Al, N and Eu, it is possible for the phosphor to have further elements, for example in the form of impurities, these impurities taken together preferably having at most one weight fraction of the phosphor of at most 0.1 per thousand or 10 ppm.

Figure 4:
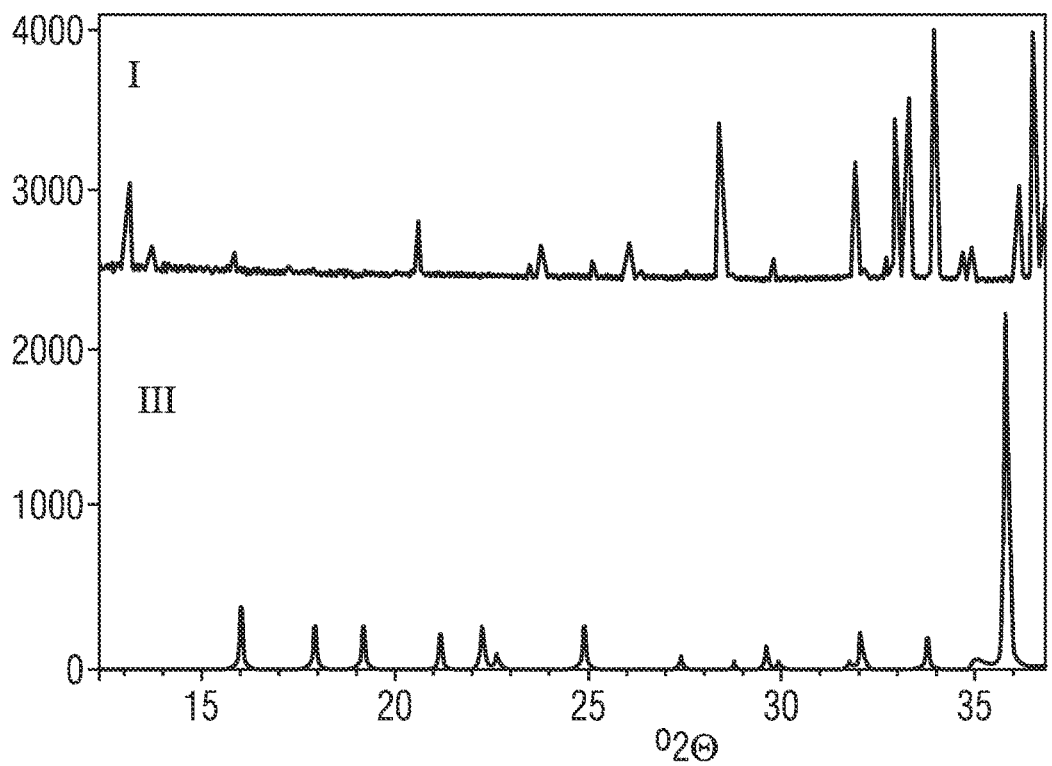

According to an embodiment, the red-emitting phosphor may comprise various phases, including the $Eu^{2+}$-doped nitridoaluminate phosphor, or it may consist of one or more further phases and the $Eu^{2+}$-doped nitridoaluminate phosphor. For example, if the red-emitting phosphor consists of two phases, one corresponding to the $Eu^{2+}$-doped nitridoaluminate phosphor, the $Eu^{2+}$-doped nitridoaluminate phosphor may have the same or similar molecular formula as the literature-known phosphor $CaLiAl_3N_4:Eu^{2+}$ (Chemistry of Materials 2014, 26, P. Pust et al., "$Ca[LiAl_3N_4]:Eu^{2+}$—a narrow-band red-emitting nitridolithoaluminate"), but has a different crystal structure and thus a different arrangement of the atoms. This can be seen from the different X-ray diffraction powder diffractograms of the phosphor according to the invention and $CaLiAl_3N_4:Eu^{2+}$ (FIG. 4).

In an embodiment, the red-emitting phosphor comprises one phase of the $Eu^{2+}$ doped nitridoaluminate phosphor and a phase of AlN or the red emitting phosphor consists of these phases.

In an embodiment, the red emitting phosphor consists of the $Eu^{2+}$-doped nitridoaluminate phosphor. This means that the red-emitting phosphor consists of only one phase, namely the $Eu^{2+}$-doped nitridoaluminate phosphor. The red-emitting phosphor may consist of the $Eu^{2+}$-doped nitridoaluminate phosphor, which is present in only one crystal structure.

It is possible that the $Eu^{2+}$-doped nitridoaluminate phosphor has the same empirical formula as the phosphor known from the literature $CaLiAl_3N_4:Eu^{2+}$ (Chemistry of Materials 2014, 26, P. Pust et al., "$Ca[LiAl_3N_4]:Eu^{2+}$—a narrow-band red-emitting nitridolithoaluminate"), but shows a different crystal structure.

In an embodiment, the red-emitting phosphor is prepared from starting materials comprising $Li_3N$, $LiAlH_4$, AlN, $Ca_3N_2$ and $EuF_3$. The phosphor can also be prepared consisting of these starting materials. Surprisingly, it has been found that the red-emitting phosphor according to the invention can be produced from these starting materials with an emission maximum between 610 and 640 nm.

In an embodiment, the molar ratio of the starting materials corresponds to the molar composition $Ca_{1-x}LiAl_3N_4Eu_x$ with x=0.001 to 0.1. In this case, the red emitting phosphor according to the invention or the $Eu^{2+}$-doped nitridoaluminate phosphor phase has a different crystal structure than the known $Ca_{1-x}LiAl_3N_4Eu_x$-phosphor. In comparison with the known $CaLiAl_3N_4:Eu^{2+}$-phosphor, the phosphor according to the invention has no rod-shaped crystals but crystals with octahedral morphology.

Energy-dispersive X-ray spectroscopy (EDX) measurements show an elemental ratio of the red-emitting phosphor within the accuracy of Ca to Al between 1:2 and 1:3.

In an embodiment, the red-emitting phosphor can be excited by radiation in the UV range to the green region of the electromagnetic spectrum. For example, the red-emitting phosphor can be excited by radiation having a wavelength of 240 nm to 600 nm, preferably 400 nm to 500 nm, for example at 460 nm.

The specified embodiments of the red-emitting phosphor can be prepared according to the following methods. All features of the red-emitting phosphor are also disclosed for the method and vice versa.

A method is disclosed of preparing a red-emitting phosphor comprising an $Eu^{2+}$-doped nitridoaluminate phosphor. The red-emitting phosphor comprises an emission maximum in the range of 610 to 640 nm of the electromagnetic spectrum. The method comprises the following method steps:

A) mixing the starting materials comprising or consisting of $Li_3N$, $LiAlH_4$, $Ca_3N_2$, AlN and $EuF_3$, B) heating the mixture obtained under A) to a temperature T1 between 900 and 1400° C., C) Annealing the mixture at a temperature T1 of 900 to 1400° C. for five minutes to 30 hours.

It has surprisingly been found that it is possible to prepare the red-emitting phosphor according to the invention, which has an emission maximum in the range from 610 to 640 nm of the electromagnetic spectrum and also a narrowband emission, from the starting materials $Li_3N$, $LiAlH_4$, $Ca_3N_2$, AlN and $EuF_3$. Thus, it is surprisingly possible to produce a red-emitting phosphor which has a significantly increased luminescence efficiency compared to the prior art.

In an embodiment, the starting materials are present as a powder.

In an embodiment, the molar ratio of $Li_3N:LiAlH_4$ is between 1:10 and 1:1, preferably between 1:5 and 1:1, for example at 1:3.

In an embodiment, T1 is between 1100 to 1300° C., for example at 1250° C. or 1125° C. and the annealing in step C) is carried out for 0.5 hours to 30 hours, preferably for one to 24 hours.

In an embodiment, T1 is at 1250° C. and the annealing in step C) is for 0.5 hours to 5 hours, for example, for one hour.

In an embodiment, T1 is 1125° C. and the annealing in step C) is for 15 hours to 30 hours, for example for 24 hours.

In an embodiment, after method step C), a further method step follows:

D) cooling the mixture to a temperature T2, where room temperature<T2<T1. Room temperature is understood to mean 20° C.

In an embodiment, another method step follows after method step D):

E) Annealing the mixture at a temperature T2 of 800 to 1300° C. for five minutes to two hours. Preferably, the annealing is carried out for five minutes to 60 minutes, more preferably for 10 minutes to 30 minutes. In particular, when process steps D) and E) take place, the annealing in process step C) can take place for five minutes to two hours, preferably for five minutes to 60 minutes, particularly preferably for 10 minutes to 30 minutes.

In an embodiment, T2 is between 800° C. and 1300° C., preferably between 900° C. and 1200° C., more preferably between 950° C. and 1100° C., for example at 1000° C.

In an embodiment, T1=1250° C. and T2=1000° C. The annealing in process steps C) and E) in this embodiment in each case can last for 10 minutes to 30 minutes, for example for 15 minutes.

In an embodiment, a further method step follows on method step C) or E):

F) Cooling of the mixture to room temperature.

In an embodiment, the mixture is cooled to room temperature in process step F) at a cooling rate of 10 to 400° C. per hour, preferably 30 to 300° C. per hour, for example at a cooling rate of 250° C. or 45° C. per hour.

In an embodiment, the cooling of the mixture to T2 in method step D) is carried out at a cooling rate of 10 to 400° C. per hour, preferably 30 to 300° C. per hour.

In an embodiment, method steps B), C), D), E) and/or F) take place under a forming gas atmosphere. Preferably, in the forming gas the ratio of nitrogen:hydrogen is 92.5:7.5.

In an embodiment, the method steps B), C), D), E) and/or F) take place in a tube furnace.

In an embodiment, the heating in step B) is carried out at a heating rate of 100 to 400° C. per hour, more preferably from 150 to 300° C. per hour, more preferably from 200 to 250° C. per hour, for example at a heating rate of 250° C. per hour.

In an embodiment, the starting materials are used in a molar ratio $AlN:Ca_3N_2:Li_3N:LiAlH_4:EuF_3=1:0.05$-$0.5:0.01$-$0.1:0.05$-$0.5:0.0001$-$0.01$. The starting materials are preferably used in a molar ratio $AlN:Ca_3N_2:Li_3N:LiAlH_4:EuF_3=1:0.05$-$0.3:0.03$-$0.09:0.05$-$0.4:0.0002$-$0.001$, the starting materials are particularly preferably used in a molar ratio $AlN:Ca_3N_2:Li_3N:LiAlH_4:EuF_3=1:0.1$-$0.2:0.06$-$0.08:0.1$-$0.3:0.0003$-$0.001$.

In an embodiment, the molar ratio of the starting materials corresponds to the molar composition $Ca_{1-x}LiAl_3N_4Eu_x$ with x=0.001 to 0.1.

The specified embodiments of the red-emitting phosphor can be employed for the uses mentioned below. All features of the red-emitting phosphor and its method of manufacture are also disclosed for the uses and vice versa.

The use of a red-emitting phosphor to convert light to longer wavelength, red light is provided. By this is meant that light is absorbed by the red-emitting phosphor and emitted as light having a longer wavelength which is in the red spectral region. The red-emitting phosphor has an emission maximum in the range of 610 nm to 640 nm of the electromagnetic spectrum.

In an embodiment of the use, the red-emitting phosphor is used to convert blue light into red light having a longer wavelength. For example, the blue light has a wavelength of 400 nm to 500 nm.

The use of a red-emitting phosphor in a conversion element is given. The red emitting phosphor has an emission maximum in the range of 610 nm to 640 nm of the electromagnetic spectrum.

In an embodiment of the use, the conversion element is part of a light-emitting diode (LED).

In an embodiment of the use, the LED comprises a semiconductor chip which, in operation, emits blue radiation in a wavelength range from 400 nm to 500 nm, for example at 460 nm. A semiconductor chip suitable for emitting blue radiation during operation is based, for example, on gallium nitride or indium gallium nitride.

Preferably, the LED emits white light. In this embodiment, the conversion element may additionally comprise a phosphor which emits radiation in the green region of the electromagnetic spectrum.

The given embodiments of the red-emitting phosphor can be used in a conversion element of a light-emitting diode.

It is given a light emitting diode. This comprises a semiconductor chip which emits blue radiation in the wavelength range from 400 nm to 500 nm during operation of the component and a conversion element comprising a red-emitting phosphor which comprises an $Eu^{2+}$-doped nitridoaluminate phosphor and which has an emission maximum in the range of 610 nm to 640 nm of the electromagnetic spectrum. During operation of the light-emitting diode, the red-emitting phosphor is set up to convert the radiation emitted by the semiconductor chip into secondary radiation having a wavelength between 610 nm and 640 nm.

Due to its high luminescence efficiency the red-emitting phosphor can be present in a lower concentration in the conversion element than previously known narrow-band red emitting phosphors, since a lower radiation intensity is needed to achieve the same efficiency.

A possible embodiment of the conversion element is the embodiment in the form of a potting, wherein the encapsulation encloses the semiconductor chip in a form-fitting manner. Furthermore, the encapsulation on the side walls, which surrounds the semiconductor chip in a form-fitting manner, can be stabilized, for example, by a housing and is located, for example, in a recess of such a housing. Materials for potting are known in the art.

Furthermore, the conversion element can be designed as a conversion layer. In the conversion layer there is a direct contact between the conversion layer and the semiconductor chip, wherein the thickness of the conversion layer is, for example, smaller than the thickness of the semiconductor chip and, for example, can be formed constant at all radiation exit surfaces.

The conversion element may also take the form of a plate or a foil. The plate or foil is disposed over the semiconductor chip. These further variants of the embodiment of the conversion element do not necessarily comprise a direct and/or form-fitting contact of the conversion element with the semiconductor chip. This means that there can be a gap between the conversion element and the semiconductor chip. In other words, the conversion element is arranged downstream of the semiconductor chip and is illuminated by the emitted radiation of the semiconductor chip. Between the conversion element and the semiconductor chip, a potting body or an air gap can then be formed.

Further advantageous embodiments and developments of the invention will become apparent from the embodiments described below in conjunction with the figures.

Figure 3:
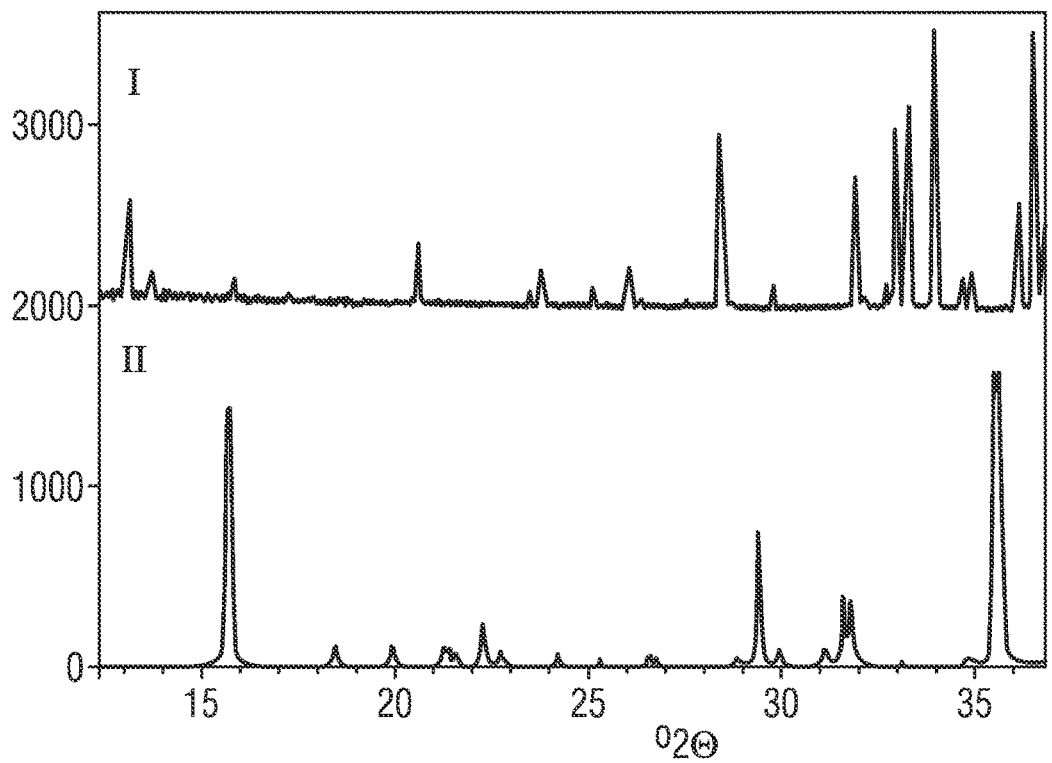

FIG. 1 shows an emission spectrum of an exemplary embodiment of a red-emitting phosphor in comparison to emission spectra of two known phosphors, FIG. 2 shows characteristic properties of a first and a second embodiment of a red-emitting phosphor in comparison to two known phosphors, FIGS. 3 and 4 show X-ray powder diffraction patterns of an embodiment of a red emitting phosphor using copper-$K_{\alpha 1}$-radiation.

FIG. 1 shows the emission spectrum of a first exemplary embodiment of the phosphor according to the invention (curve with the reference symbol Ia). In addition, an emission spectrum of the known phosphor $CaLiAl_3N_4:Eu^{2+}$ (curve with the reference numeral Ma) and an emission spectrum of the known phosphor $SrLiAl_3N_4:Eu^{2+}$ (curve with the reference numeral IIa) is shown. The wavelength is plotted in nanometers on the x-axis and the emission intensity in percent on the y-axis.

To measure the emission spectra, the phosphor according to the invention was excited with a blue LED having an emission radiation of 460 nm. The phosphor according to the invention has a half-width of 57 nm and a dominant wavelength of 611 nm, the maximum of the emission is 634 nm. Thus, the phosphor of the present invention emits almost only in the visible region of the electromagnetic spectrum, resulting in an increase in the overlap with the eye sensitivity curve and thus in the reduction of efficiency losses. The known phosphor $CaLiAl_3N_4:Eu^{2+}$ was excited with an emission radiation of 470 nm and the known phosphor $SrLiAl_3N_4:Eu^{2+}$ was excited with an emission radiation of 440 nm. As can be seen, the known phosphor $SrLiAl_3N_4:Eu^{2+}$ has an emission maximum at about 650 nm and the known phosphor $CaLiAl_3N_4:Eu^{2+}$ an emission maximum at about 670 nm.

The half-widths of the known phosphors are approximately in the same range as in the phosphor according to the invention. Due to the emission maximum of the phosphor according to the invention, which is shifted into the blue spectral range in comparison with the known phosphors, the inventive phosphor has a significantly increased luminescence efficiency. The phosphor according to the invention thus has an increased overlap with the eye sensitivity curve, which leads to the reduction of efficiency losses.

The first embodiment of the phosphor according to the invention, which has the emission spectrum with the reference Ia in FIG. 1, was prepared as follows: 0.064 mol $Ca_3N_2$, 0.032 $Li_3N$, 0.096 mol $LiAlH_4$, 0.432 mol AlN and 0.00019 mol $EuF_3$ are homogeneously mixed. The molar ratio $AlN:Ca_3N_2:Li_3N:LiAlH_4:EuF_3$ is 1:0.148:0.074:0.22:0.00044. This corresponds to a europium content of 0.1 mol % with respect to the amount of Ca in the starting materials. The mixture is transferred to a tungsten crucible, which is transferred to a tube furnace. Under a forming gas atmosphere ($N_2:H_2=92.5:7.5$), the mixture is heated at a heating rate of 250° C. per hour to a temperature of 1250° C. The mixture is annealed for one hour at a temperature of 1250° C., followed by cooling to room temperature with a cooling rate of 250° C. per hour.

FIG. 2 shows characteristic data of the first embodiment (A1) and a second embodiment (A2) in comparison to the known phosphors $SrLiAl_3N_4:Eu^{2+}$ and $CaLiAl_3N_4:Eu^{2+}$. $\lambda_{dom}$ is the dominant wavelength in nanometers, $\lambda_{max}$ is the maximum emission in nanometers, x, y are the coordinates of the emitted radiation within the CIE standard table (1931), LE is the luminescence efficiency in % and FWHM is the half-width in nanometers. The luminescence efficiency is given in percent and refers to the maximum of the luminescence efficiency at 555 nm. At 555 nm, the luminescence is 683 lumens/watt. The data provided with * are taken from the literature or are calculated from the literature data. All other data are experimental data of the inventors. The synthesis of the first embodiment A1 is described under with FIG. 1.

The second embodiment of the phosphor according to the invention was prepared as follows: 9.430 g $Ca_3N_2$, 1.112 g $Li_3N$, 3.630 g $LiAlH_4$, 17.670 g AlN and 0.158 g $EuF_3$ are homogeneously mixed. The mixture is transferred to a tungsten crucible, which is transferred to a tube furnace. Under a forming gas atmosphere ($N_2:H_2=92.5:7.5$), the mixture is heated at a heating rate of 250° C. per hour to a temperature of 1125° C. The mixture is annealed for 24 hours at a temperature of 1125° C., followed by a cooling to room temperature with a cooling rate of 45° C. per hour.

FIG. 3 shows two X-ray powder diffraction patterns using copper-$K_{\alpha 1}$-radiation. The diffraction angles are given in ° 2θ-values on the x-axis and the intensity on the y-axis. The X-ray powder diffraction pattern provided with the reference I shows the diffraction pattern of the first embodiment of the red-emitting phosphor according to the invention, which was synthesized as provided under FIG. 1. The X-ray diffraction data were recorded by means of a surface sample carrier on a powder diffractometer (PANalytical Empyrean) with X-Celerator CCD detector in Bragg-Brentano geometry. The X-ray diffraction powder pattern provided with reference II is a simulated diffraction pattern of the compound of formula $SrLiAl_3N_4$ based on Nature Materials 2014, P. Pust et al., "Narrow-band red-emitting $Sr[LiAl_3N_4]$:$Eu^{2+}$ as a next-generation LED-phosphor material". From the illustrated X-ray powder diffraction patterns it is clear that the red-emitting phosphor according to the invention has a different crystal structure than the known phosphor of the formula $SrLiAl_3N_4:Eu^{2+}$.

FIG. 4 shows two X-ray powder diffraction patterns using copper-$K_{\alpha 1}$-radiation. The diffraction angles are given in ° 2θ-values on the x-axis and the intensity on the y-axis. The X-ray powder diffraction pattern provided with the reference I shows that of the first embodiment of the red emitting phosphor according to the invention, which was synthesized as provided under FIG. 1. The X-ray diffraction data were recorded by means of a surface sample carrier on a powder diffractometer (PANalytical Empyrean) with X-Celerator CCD detector in Bragg-Brentano geometry. The X-ray powder diffraction pattern provided with the reference III is a simulated compound of the formula $CaLiAl_3N_4$ based on Chemistry of Materials 2014, 26, P. Pust et al., "Ca$[LiAl_3N_4]:Eu^{2+}$—a narrow-band red-emitting nitridolithoaluminate". From the illustrated X-ray powder diffraction patterns it is clear that the red emitting phosphor of the invention has a different crystal structure than the known phosphor of the formula $CaLiAl_3N_4:Eu^{2+}$.

The invention is not limited by the description based on the embodiments therein. Rather, the invention encompasses any novel feature as well as any combination of features, which includes in particular any combination of features in the patent claims, even if this feature or combination itself is not explicitly stated in the patent claims or exemplary embodiments.

This patent application claims the priority of German Patent Application 10 2015 119 149.0, the disclosure of which is hereby incorporated by reference.

REFERENCE NUMBERS

E emission intensity
Ia, IIIa, IIa emission spectra
nm nanometer
$\lambda$ wavelength
A1 first embodiment
A2 second embodiment
$\lambda_{dom}$ dominant wavelength
$\lambda_{max}$ maximum emission
x,y coordinates in the CIE standard table (1931)
LE luminescence efficiency
FWHM half-width
I, II, III X-ray powder diffraction patterns

The invention claimed is:

1. A red-emitting phosphor comprising an $Eu^{2+}$ doped nitridoaluminate phosphor, wherein the red-emitting phosphor comprises an emission maximum in the range of 610 to 640 nm of the electromagnetic spectrum, and wherein the red-emitting phosphor comprises a half-width of less than 65 nm.

2. Red-emitting phosphor according to claim 1, wherein the red-emitting phosphor comprises the elements Ca, Li, Al, N and Eu.

3. Red-emitting phosphor according to claim 1, wherein the red-emitting phosphor consists of the elements Ca, Li, Al, N and Eu.

4. Red-emitting phosphor according to claim 3, wherein the red-emitting phosphor is prepared from starting materials comprising $Li_3N$, $LiAlH_4$, AlN, $Ca_3N_2$ and $EuF_3$.

5. Red-emitting phosphor according to claim 4, wherein the molar ratio of the starting materials corresponds to the molar composition $Ca_{1-x}LiAl_3N_4Eu_x$, where x=0.001 to 0.01.

6. Red-emitting phosphor according to claim 1, wherein the red-emitting phosphor comprises a dominant wavelength of $\lambda$<620 nm.

7. A red-emitting phosphor comprising an $Eu^{2+}$ doped nitridoaluminate phosphor, wherein the red-emitting phosphor comprises an emission maximum in the range of 610 to 640 nm of the electromagnetic spectrum, and wherein the red-emitting phosphor comprises a dominant wavelength of $\lambda$<620 nm.

8. Red-emitting phosphor according to claim 7, wherein the red-emitting phosphor has a half-width of less than 65 nm, and the red-emitting phosphor comprises the elements Ca, Li, Al, N and Eu.

9. Red-emitting phosphor according to claim 7, wherein the red-emitting phosphor comprises the elements Ca, Li, Al, N and Eu.

10. Red-emitting phosphor according to claim 7, wherein the red-emitting phosphor consists of the elements Ca, Li, Al, N and Eu.

11. Red-emitting phosphor according to claim 7, wherein the red-emitting phosphor is prepared from starting materials comprising $Li_3N$, $LiAlH_4$, AlN, $Ca_3N_2$ and $EuF_3$.

12. Red-emitting phosphor according to claim 11, wherein the molar ratio of the starting materials corresponds to the molar composition $Ca_{1-x}LiAl_3N_4Eu_x$, where x=0.001 to 0.01.

13. A red-emitting phosphor comprising an $Eu^{2+}$ doped nitridoaluminate phosphor, wherein the red-emitting phosphor comprises an emission maximum in the range of 610 to 640 nm of the electromagnetic spectrum, and wherein the red-emitting phosphor is prepared from starting materials comprising $Li_3N$, $LiAlH_4$, AlN, $Ca_3N_2$ and $EuF_3$.

14. Red-emitting phosphor according to claim 13, wherein the red-emitting phosphor has a half-width of less than 65 nm, and the red-emitting phosphor comprises the elements Ca, Li, Al, N and Eu.

15. Red-emitting phosphor according to claim 13, wherein the red-emitting phosphor comprises an emission maximum in the range of 620 to 635 nm.

16. Red-emitting phosphor according to claim 13, wherein the molar ratio of the starting materials corresponds to the molar composition $Ca_{1-x}LiAl_3N_4Eu_x$, where x=0.001 to 0.01.

* * * * *